United States Patent
Fontaine et al.

(10) Patent No.: US 7,221,300 B2
(45) Date of Patent: May 22, 2007

(54) DIGITAL-TO-ANALOG CONVERTER DATA RATE REDUCTION BY INTERLEAVING AND RECOMBINATION THROUGH MIXER SWITCHING

(75) Inventors: Paul A. Fontaine, Plano, TX (US); Ranjit Gharpurey, Ann Arbor, MI (US); Anuj Batra, Dallas, TX (US); Jaiganesh Balakrishnan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 99 days.

(21) Appl. No.: 10/851,365

(22) Filed: May 21, 2004

(65) Prior Publication Data

US 2005/0258992 A1    Nov. 24, 2005

(51) Int. Cl.
*H03M 1/00* (2006.01)
(52) U.S. Cl. .................. 341/136; 341/141; 341/142; 341/144
(58) Field of Classification Search ........ 341/141–145; 455/112, 115, 119, 126, 127, 315, 313, 118; 375/140, 260, 295, 316, 298, 302
See application file for complete search history.

(56) References Cited

U.S. PATENT DOCUMENTS

| | | | | |
|---|---|---|---|---|
| 5,978,662 A * | 11/1999 | Swales | ................. | 455/126 |
| 6,088,399 A * | 7/2000 | Luz et al. | ................. | 375/260 |
| 6,674,999 B2 * | 1/2004 | Ramachandran | ............ | 455/522 |
| 6,703,956 B1 * | 3/2004 | Mueller et al. | ............. | 341/145 |
| 6,724,335 B1 * | 4/2004 | Gomez et al. | ............... | 341/144 |
| 2002/0089995 A1 * | 7/2002 | Shalvi et al. | ................ | 370/431 |
| 2003/0081693 A1 * | 5/2003 | Raghavan et al. | .......... | 375/298 |
| 2003/0087634 A1 * | 5/2003 | Raghavan et al. | .......... | 455/423 |
| 2004/0063418 A1 * | 4/2004 | Kluge et al. | ................ | 455/315 |
| 2004/0174199 A1 * | 9/2004 | Simon | ........................ | 327/256 |

* cited by examiner

*Primary Examiner*—Linh Nguyen
(74) *Attorney, Agent, or Firm*—Wade James Brady, III; Frederick J. Telecky, Jr.

(57) ABSTRACT

A system and method implement very high data rate baseband DACs suitable for wireless applications related to new standards (e.g. Ultra-Wide Band) using CMOS processes allowing an integrated solution with the deep-submicron CMOS digital baseband. A single CMOS block working at full speed is discarded in favor of several blocks, each working at a fraction of the original data rate.

21 Claims, 3 Drawing Sheets

DIGITAL-TO-ANALOG CONVERTER DATA RATE REDUCTION BY INTERLEAVING AND RECOMBINATION THROUGH MIXER SWITCHING

BACKGROUND OF THE INVENTION

1. Field of the Invention

This invention relates generally to digital to analog conversion, and more particularly to a system and method for reducing the high data rate of baseband DACs (Digital to Analog Converter) for transmitter applications.

2. Description of the Prior Art

Typical wireless transmitters use a relatively narrow baseband fbw signal sampled at $f_s$ rate (for GSM fbw=100 kHz and $f_s$ is around 2.16 MHz; for WCDMA fbw=3.84 MHz and $f_s$=15.36 MHz) up-converted at a much larger offset frequency $f_{lo}$ (for GSM $f_{lo}$=1.8502-1.9098 GHz; for WCDMA $f_{lo}$=1.92-1.98 GHz). The front-end consists of a Digital-to-Analog Converter (DAC), followed by filtering and up-conversion. The relatively low bandwidth of the baseband signal makes the DAC easily implemented by conventional CMOS structures (mostly current-steering). The output of the DAC is then filtered to remove the image and up-converted in one step (direct conversion) or two steps (super heterodyne) by mixing operations. FIG. 1 is a block diagram illustrating one exemplary direct conversion transmitter 100 that is known in the art. FIG. 2 is a block diagram illustrating one exemplary super heterodyne transmitter 200 that is known in the art.

Some new standards require a much wider baseband signal (for UWB $f_s$=1 GHz) making the implementation of the DAC a difficult task in a pure CMOS process. The power required for analog circuits using CMOS processes, for example, increases exponentially with their required speed.

In view of the foregoing, it is highly desirable and advantageous to provide a scheme for implementing very high data rate baseband DACs suitable for wireless applications related to new standards (e.g. Ultra-Wide Band) using CMOS processes allowing an integrated solution with the deep-submicron CMOS digital baseband.

SUMMARY OF THE INVENTION

The present invention is directed to a scheme for implementing very high data rate baseband DACs suitable for wireless applications related to new standards (e.g. Ultra-Wide Band) using CMOS processes allowing an integrated solution with the deep-submicron CMOS digital baseband. A single CMOS block working at full speed is discarded in favor of several blocks, each working at a fraction of the original data rate.

Similar schemes have been implemented for high speed ADCs (Analog to Digital Converter). Demuxing the input into several ADCs is done by naturally interleaving Sample and Hold circuits, bringing the signal into a sampled time domain. Regarding DACs however, the output is a continuous time signal, making the recombination (muxing) implementation very complicated and inefficient. The use of interleaved DACs has therefore been seldom. When the DAC output is up-converted however, the combination of the DAC with the mixer stage provides an elegant and efficient solution for signal recombination through the mixer switching mechanism. When the mixer LO (Local Oscillator) frequency $f_{lo}$ is an integer multiple of the DAC data frequency $f_s$ (generally itself a multiple of the symbol rate), one can transform the single DAC at rate $f_s$ into a quantity N of DACs, each running at a rate of $f_s/N$. This parallelization (or interleaving) is only possible through the switching mechanism of the mixer. Each DAC output is connected to a mixer having 3 possible multiplying values (−1, 1 and 0). When equal to successive −1 or 1 values, the DAC output is normally upconverted around $f_{lo}$; when equal to 0, the DAC output is masked. The summation of the N outputs can be naturally implemented via N current mode mixers sharing the same load.

According to one embodiment, a digital-to-analog (DAC) conversion transmitter comprises:

a demultiplexer operational to demultiplex a digital baseband (DBB) input signal $f_s$;

a plurality (N) of DACs, each DAC operational to receive desired demultiplexed DBB input signals $f_s/N$ generated via the demultiplexer and to generate analog output signals there from; and a mixer switching mechanism operational to recombine the analog output signals and generate an up-converted DAC signal there from.

According to another embodiment, a digital-to-analog (DAC) conversion transmitter comprises:

means for demultiplexing a digital baseband (DBB) input signal $f_s$ and generating demultiplexed input signals $f_s/N$ there from, wherein N is a desired integer value;

a plurality (N) of DACs, wherein each DAC is configured to receive desired demultiplexed DBB input signals $f_s/N$ generated via the demultiplexing means and to generate analog output signals there from; and means for recombining the analog output signals and generating an up-converted DAC signal there from.

According to yet another embodiment of the present invention, a method of digital-to-analog (DAC) signal conversion, comprises the steps of:

providing a demultiplexer, a quantity N of pure CMOS DACs and a mixer switching mechanism, wherein N is a desired integer value;

demultiplexing a digital baseband (DBB) input signal and generating a plurality of DBB input signals at a sample rate $f_s/N$;

converting each DBB input signal $f_s/N$ into an analog signal via a single DAC selected from the N DACs; and recombining the analog signals via the mixer switching mechanism to generate an upconverted analog signal.

According to still another embodiment of the present invention, a digital-to-analog (DAC) conversion transmitter comprises:

a demultiplexer operational to demultiplex a digital baseband (DBB) input signal $f_s$ into a plurality (N) of DBB input signals $f_s/N$, wherein N is a desired integer value;

a plurality (N) of DACs, each DAC operational to receive desired demultiplexed DBB input signals $f_s/N$ generated via the demultiplexer and to generate analog output signals there from;

a first mixer stage associated with a first local oscillator clock;

a second mixer stage associated with a second local oscillator clock; and a mixer switching mechanism operational selectively switch the first mixer stage and the second mixer stage to recombine the analog output signals and generate an up-converted DAC signal there from.

According to still another embodiment, a digital-to-analog (DAC) conversion transmitter comprises:

a demultiplexer operational to demultiplex a digital baseband (DBB) input signal $f_s$ into a plurality (N) of DBB input signals $f_s/N$, wherein N is a desired integer value;

a plurality (N) of DACs, each DAC operational to receive desired demultiplexed DBB input signals $f_s/N$ generated via the demultiplexer and to generate analog output signals there from;

a plurality of mixer stages, each mixer stage associated with a single unique local oscillator clock; and a mixer switching mechanism operational selectively activate and deactivate the plurality of mixer stages to recombine the analog output signals and generate an up-converted DAC signal there from.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Some new standards, as stated herein before, require a very wide baseband signal (for UWB, $f_s$=1 GHz) making the implementation of a DAC a difficult task in a pure CMOS process. The present inventors however, alone recognized that if the channel frequency $f_{ch}$ is a multiple of the DAC sampling frequency $f_s$, the DAC can be multiplied, and the respective outputs recombined through a mixer switching mechanism.

Figure 1:
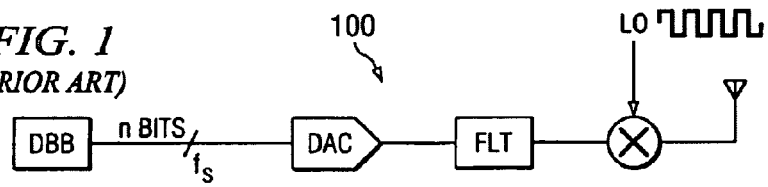
FIG. 1 is a block diagram illustrating a direct conversion process that is known in the prior art.
Figure 2:
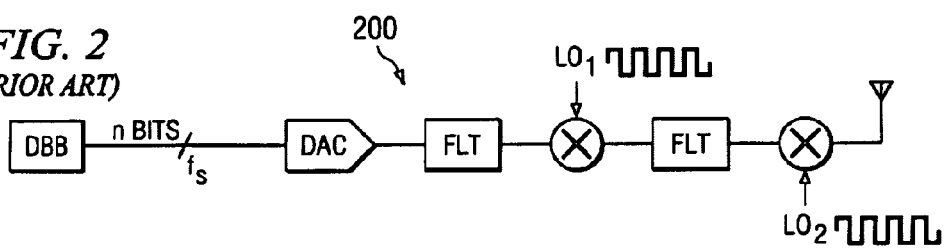
FIG. 2 is a block diagram illustrating a super heterodyne process that is known in the prior art.
Figure 3:
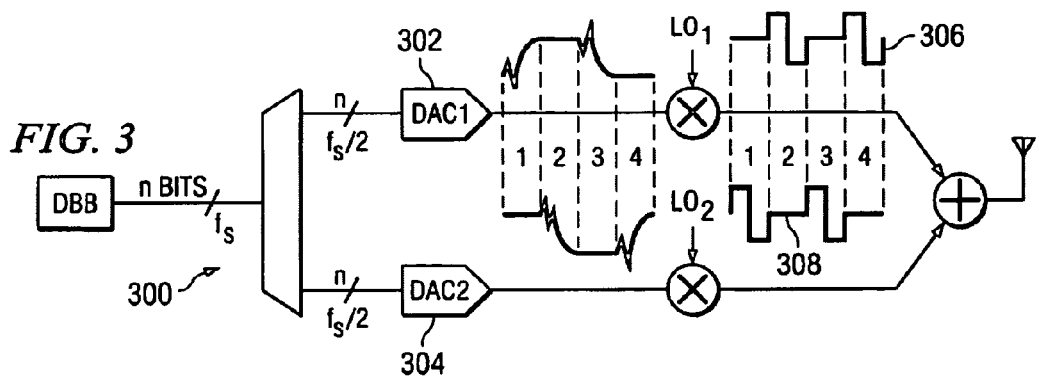
FIG. 3 is a block diagram illustrating a direct conversion process according to one embodiment of the present invention.

Looking now at FIG. 3, a block diagram illustrates a direct conversion process 300 according to one embodiment of the present invention. FIG. 3 depicts this approach where a first DAC (DAC1) 302 and a second DAC (DAC2) 304 are each operating at half the sample rate $f_s/2$. The clock signals 306, 308 on the mixers LO1 and LO2 can be seen to have a 180° phase shift and are synchronized with their respective DAC 302 and DAC 304.

In summary explanation, when the mixer LO (Local Oscillator) frequency $f_{lo}$ is an integer multiple of the DAC data frequency $f_s$, (itself a multiple of the symbol rate), it is possible to transform the DAC at rate $f_s$ into a number of N DACs at rate $f_s/N$. This parallelization (or interleaving), as stated herein before, is only possible through the switching mechanism of the mixer. Each DAC output is connected to a mixer having 3 possible multiplying values (–1, 1 and 0). When equal to successive –1 or 1, the DAC output is normally up-converted around $f_{lo}$, and when equal to 0, the DAC output is masked. The summation of the N outputs can be naturally achieved, for example, using N current mode mixers sharing the same load.

Figure 4:
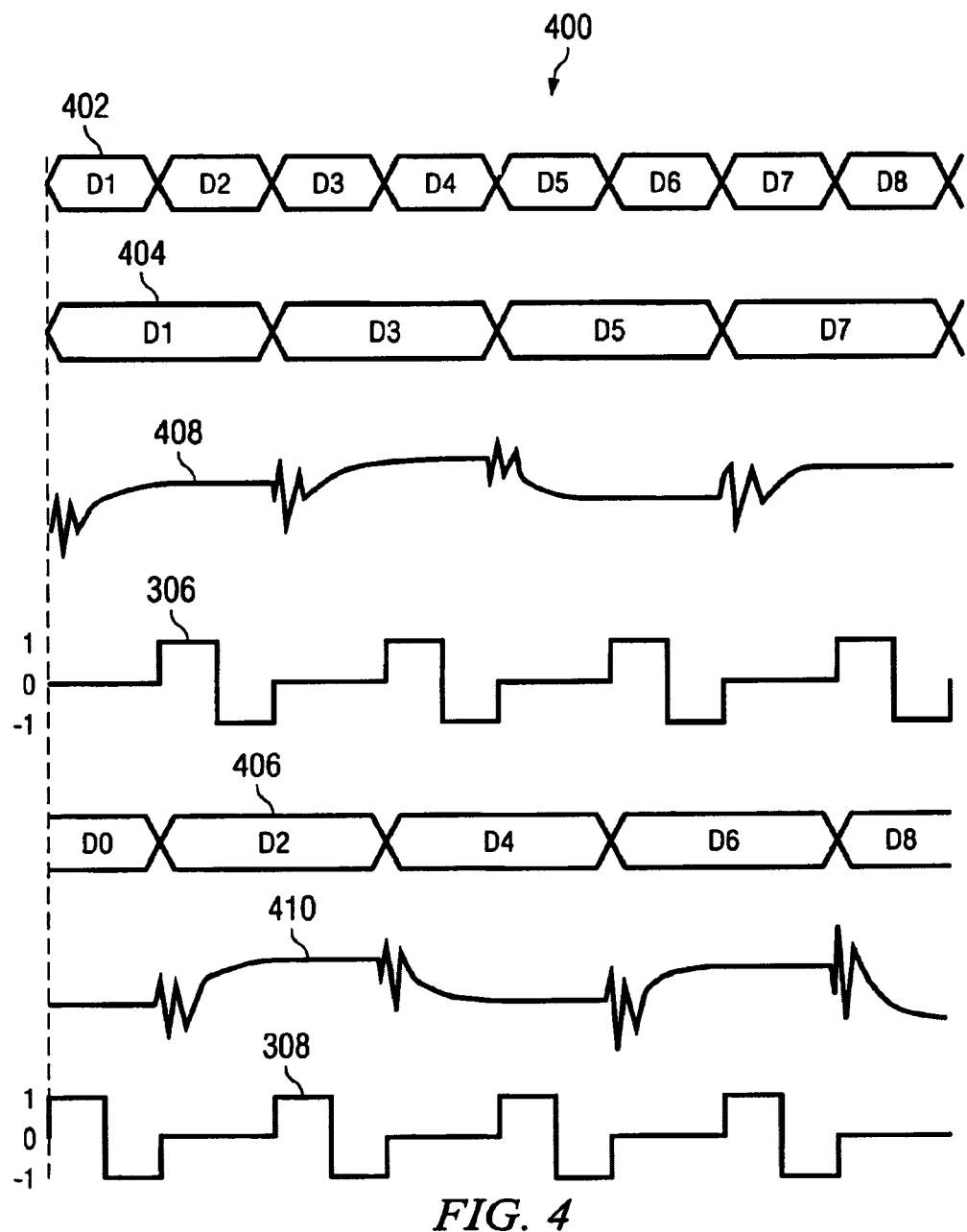
FIG. 4 is a timing diagram for the process shown in FIG. 3.

FIG. 4 is a timing diagram 400 more clearly illustrating operation of the direct conversion process 300 shown in FIG. 3. The top waveform is a digital baseband signal (DBB) 402. After multiplexing the DBB 402, the input to DAC1 (302) is shown as waveform 404, while the input to DAC2 (304) is shown as 406. The analog signal generated via DAC1 (302) is then depicted via waveform 408, while the analog signal generated via DAC2 (304) is depicted via waveform 410. The clock signals on the mixers LO1 and LO2 are represented via waveform signals 306 and 308 respectively, as stated herein before. The analog signals generated via DAC1 (302) and DAC2 (304) are then recombined through the switching mechanism of the mixer.

Figure 5:
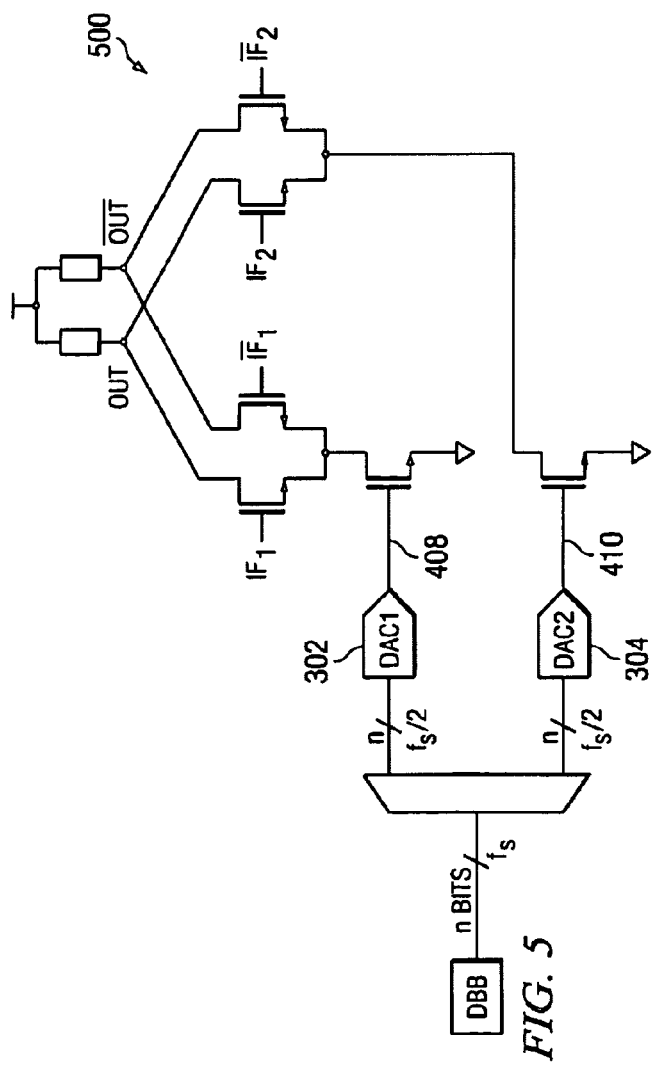
FIG. 5 is a schematic diagram illustrating recombination through a mixer switching mechanism that is suitable to implement the direct conversion process shown in FIG. 3.

FIG. 5 shows a mixer switching mechanism 500 according to one embodiment that is suitable to recombine the DAC 302, 304 analog output signals 408, 410. Even if the channel frequency $f_{ch}$ is not a multiple of the DAC 302, 304 sampling frequency $f_s$, it is possible to find an Intermediate Frequency (IF) that is a multiple of $f_s$, and then implement a two step up-conversion (super heterodyne) process, such as shown in FIG. 6.

Figure 6:
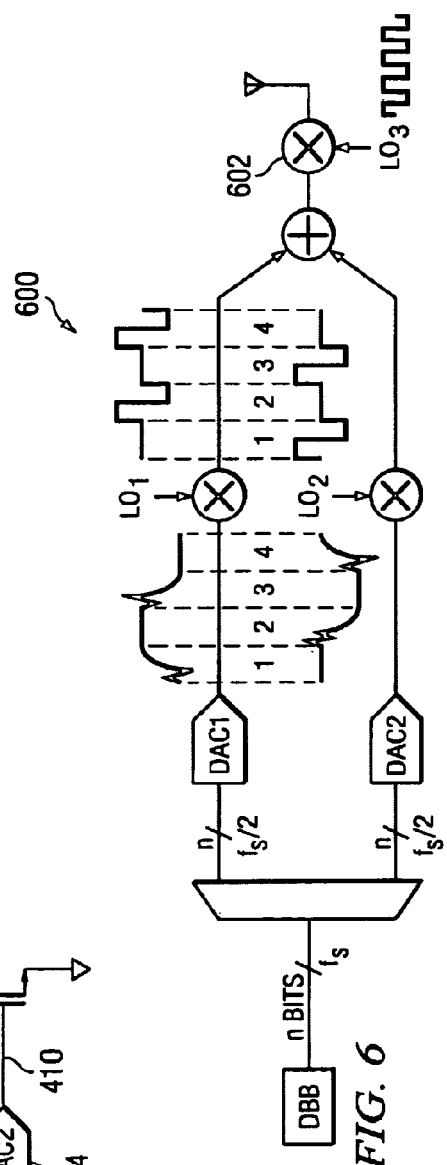
FIG. 6 is a block diagram illustrating a super heterodyne process using a two step up-conversion technique according to one embodiment of the present invention.

With reference now to FIG. 6, a two step up-conversion process 600 can be seen to include the direct conversion process 300 shown in FIG. 3 in which the direct conversion output signal is passed through one additional mixer 602. The one additional mixer 602 employs a third clock signal LO3 (604) in a second step to implement the final up-conversion.

In view of the above, it can be seen the present invention presents a significant advancement in the art of DAC design. This invention has been described in considerable detail in order to provide those skilled in the digital-to-conversion art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A digital-to-analog (DAC) conversion transmitter comprising:

a demultiplexer operational to demultiplex consecutive signals of a digital baseband (DBB) input signal $f_s$ at rate $f_s/N$, where $f_s$ is a multiple of the signal rate;

a plurality (N) of DACs, each DAC operational to receive desired demultiplexed DBB input signals $f_s/N$ generated via the demultiplexer and to generate unconverted analog output signals therefrom, where N is the number of DACs; and a mixer switching mechanism operational to recombine the analog output signals and generate an up-converted DAC signal therefrom, where the mixer frequency is an integer multiple of the DAC data frequency $f_s$.

2. The DAC conversion transmitter according to claim 1, further comprising a second mixer stage operational to up-convert the recombined and up-converted DAC signal.

3. The DAC conversion transmitter according to claim 2, wherein the plurality of DACs are implemented via a pure CMOS process compatible with the deep-submicron CMOS digital baseband.

4. The DAC conversion transmitter according to claim 1, wherein the plurality of DACs are implemented via a pure CMOS process compatible with the deep-submicron CMOS digital baseband.

5. A digital-to-analog (DAC) conversion transmitter comprising:
   means for demultiplexing consecutive signals of a digital baseband (DBB) input signal $f_s$ and generating demultiplexed input signals $f_s/N$ therefrom, wherein N is a desired integer value and $f_s$ is a multiple of the signal rate;
   a plurality (N) of DACs, each DAC configured to receive desired demultiplexed DBB input signals $f_s/N$ generated via the demultiplexing means and to generate unconverted analog output signals therefrom where N is the number of DACs; and
   means for recombining the analog output signals and generating an up-converted DAC signal therefrom, where said means operates at a frequency which is an integer multiple of the DAC data frequency $f_s/N$.

6. The DAC conversion transmitter according to claim 1, further comprising means for up-converting the recombined and up-converted DAC signal.

7. The DAC conversion transmitter according to claim 6, wherein the plurality of DACs are implemented via a pure CMOS process compatible with the deep-submicron CMOS digital baseband.

8. The DAC conversion transmitter according to claim 5, wherein the plurality of DACs are implemented via a pure CMOS process compatible with the deep-submicron CMOS digital baseband.

9. The DAC conversion transmitter according to claim 5, wherein the means for recombining the analog output signals and generating an up-converted DAC signal there from comprises a plurality N of mixers, wherein each mixer is associated with a single unique clock signal, such that each clock signal is phase shifted with respect to each other clock signal and synchronized with a single respective DAC selected from the N DACs.

10. A method of digital-to-analog (DAC) signal conversion, the method comprising the steps of:
   providing a demultiplexer operational to demultiplex consecutive signals of a digital baseband (DBB) input signal $f_s$ at rate $f_s/N$, where $f_s$ is a multiple of the signal rate, a quantity N of pure CMOS DACs, each DAC operational to receive desired demultiplexed DBB input signals $f_s/N$ generated via the demultiplexer and to generate unconverted analog output signals thereform, where N is the number of DACs, and a mixer switching mechanism operational to combine the analog output signals and generate an up-converted DAC signal therefrom, where the mixer frequency is an integer multiple of the DAC data frequency $f_s/N$ and wherein N is a desired integer value;
   demultiplexing in said demultiplexer consecutive signals of a digital baseband (DBB) input signal and generating a plurality of DBB input signals at a sample rate $f_s/N$;
   converting each said consecutive DBB input signal $f_s/N$ into an analog signal via a different single DAC selected from the N DACs; and
   recombining the analog signals via the mixer switching mechanism to generate an upconverted analog signal.

11. The method according to claim 10, further comprising the steps of:
   further providing a second stage mixer; and
   upconverting the upconverted analog signal to implement a two step up-conversion (super heterodyne) process.

12. The method according to claim 10, wherein the mixer switching mechanism comprises a plurality N of mixers, each mixer associated with a single unique clock signal, such that each clock signal is phase shifted with respect to each other clock signal and synchronized with a single respective DAC selected from the N DACs.

13. A digital-to-analog (DAC) conversion transmitter comprising:
   a demultiplexer operational to demultiplex consecutive signals of a digital baseband (DBB) input signal $f_s$ into a plurality (N) of DBB input signals $f_s/N$, wherein N is a desired integer value and $f_s$ is a multiple of the signalrate;
   a plurality (N) of DACs, each DAC operational to receive alternate said demultiplexed DBB input signals $f_s/N$ generated via the demultiplexer and to generate analog output signals therefrom, where N is the number of DACs;
   a first mixer stage associated with a first local oscillator clock, and a second mixer stage associated with a second local oscillator clock, wherein said first and second local oscillator clocks have frequency which is an integer multiple of the DAC data frequency $f_s/N$; and
   a mixer switching mechanism operational to selectively switch the first mixer stage and the second mixer stage to recombine the analog output signals and generate an up-converted DAC signal therefrom.

14. The DAC conversion transmitter according to claim 13, further comprising a third mixer stage operational to up-convert the recombined and up-converted DAC signal generated via the first and second mixer stages.

15. The DAC conversion transmitter according to claim 14, wherein the plurality of DACs are implemented via a pure CMOS process compatible with the deep-submicron CMOS digital baseband.

16. The DAC conversion transmitter according to claim 13, wherein the plurality of DACs are implemented via a pure CMOS process compatible with the deep-submicron CMOS digital baseband.

17. The DAC conversion transmitter according to claim 13, wherein the first local oscillator clock is 180 degrees out of phase with the second local oscillator clock.

18. A digital-to-analog (DAC) conversion transmitter comprising:
   a demultiplexer operational to demultiplex consecutive signals of a digital baseband (DBB) input signal $f_s$ into a plurality (N) of DBB input signals $f_s/N$, wherein N is a desired integer value and $f_s$ is a multiple of the signal rate;
   a plurality (N) of DACs, each DAC operational to receive alternate said desired demultiplexed DBB input signals $f_s/N$ generated via the demultiplexer and to generate analog output signals therefrom, where N is the number of DACs;

a plurality of mixer stages, each mixer stage associated with a single unique local oscillator clock, each mixer stage frequency being an integer multiple of the DAC data frequency $f_s/N$; and a mixer switching mechanism operational to selectively activate and deactivate the plurality of mixer stages to recombine the analog output signals and generate an up-converted DAC signal therefrom.

19. The DAC conversion transmitter according to claim 18, further comprising a super heterodyne mixer stage operational to up-convert the recombined and up-converted DAC signal generated via the plurality of mixer stages.

20. The DAC conversion transmitter according to claim 19, wherein the plurality of DACs are implemented via a pure CMOS process compatible with the deep-submicron CMOS digital baseband.

21. The DAC conversion transmitter according to claim 18, wherein the plurality of DACs are implemented via a pure CMOS process compatible with the deep-submicron CMOS digital baseband.

* * * * *